United States Patent [19]
Mudgett

[11] Patent Number: 5,099,140
[45] Date of Patent: Mar. 24, 1992

[54] SYNCHRONOUS CLOCK SOURCE SELECTOR

[75] Inventor: Dan S. Mudgett, Austin, Tex.

[73] Assignee: Advanced Micro Devices, Inc., Sunnyvale, Calif.

[21] Appl. No.: 575,594

[22] Filed: Aug. 31, 1990

[51] Int. Cl.⁵ .................... H03K 5/13; H03K 19/00
[52] U.S. Cl. .................................. 307/269; 307/480; 328/63
[58] Field of Search .................. 307/269, 243, 480; 328/72, 63, 104, 154

[56] References Cited

U.S. PATENT DOCUMENTS

| | | | |
|---|---|---|---|
| 4,229,699 | 10/1980 | Frissell | 307/269 |
| 4,651,103 | 3/1987 | Grimes | 307/269 |
| 4,686,386 | 8/1987 | Tadao | 307/269 |
| 4,794,596 | 12/1988 | Gloyne et al. | 370/103 |
| 4,965,524 | 10/1990 | Patchen | 307/269 |

Primary Examiner—Edward P. Westin
Assistant Examiner—Richard Roseen
Attorney, Agent, or Firm—Foley & Lardner

[57] ABSTRACT

A clock source selector provides at least one set of clock signals selected from a plurality of clock sources and a synchronized transition from an old clock source to a new clock source. The clock source selector includes a gate having an output for providing the clock signals, a selector coupled between the plurality of clock sources and the gate for providing the gate with clock signals from selected ones of the clock sources responsive to selection signals, a detector for detecting a change in the selection signals from an old clock source to a new clock source, and a synchronizing circuit responsive to the detector for disabling the gate in synchronism with the old clock source and thereafter enabling the gate in synchronism with the new clock source.

19 Claims, 2 Drawing Sheets

SYNCHRONOUS CLOCK SOURCE SELECTOR

BACKGROUND OF THE INVENTION

The present invention generally relates to a clock source selector circuit which provides at least one set of clock signals which are selected from a plurality of clock sources and more particularly to such a clock source selector circuit which provides a plurality of clock signal sets from a plurality of available fixed clock sources. The clock source selector, when a new clock source is to be selected, interrupts the clock signals synchronously with an old clock source, provides the clock source transition to the new clock source, and thereafter restarts the clock signals in synchronism with the new clock source.

Sources of clock signals are required in many applications. One such application is in central processing systems wherein the central processing unit clock frequency of the system must be varied to meet certain demands. For example, during periods of high activity when the central processing unit is performing and executing instructions at a high rate, the clock signal frequency must be high, but when the central processing unit activity is low and the central processing unit is performing and executing instructions at a slow rate, the clock signal frequency must be reduced to conserve power. In addition, many systems, such as central processing systems, require many sources of clock signals.

In the prior art, such sources of clock signals have been derived by programmable clock source circuits such as programmable dividers. These circuits are generally complex and consume a large amount of power. While these circuits have been generally successful, they are not well suited to portable system applications such as compact, lap-top personal computers.

As a result, there is a need in the art for an improved source of clock signals. The present invention provides such an improvement by implementing a programmable clock source selector which selects from a plurality of fixed clock sources. The clock source selector of the present invention operates independently of the phase relationships of the fixed clock sources and provides for synchronous clock source selection.

SUMMARY OF THE INVENTION

The invention provides a clock source selector for providing at least one set of clock signals selected from a plurality of clock sources, wherein the clock source selector provides synchronized transitions from an old clock source to a new clock source and includes gate means having an output for providing the clock signals and clock source select means coupled between the plurality of clock sources and the gate means for providing the gate means with clock signals from selected ones of the clock sources responsive to selection signals. The clock source selector further includes detect means for detecting a change in the selection signals from an old clock source to a new clock source and synchronizing means responsive to the detect means for disabling the gate means in synchronism with the old clock source and thereafter enabling the gate means in synchronism with the new clock source.

The present invention further provides a clock source selector for providing at least first and second sets of clock signals selected from a plurality of clock sources, wherein the clock source selector provides synchronized transitions between present and new selected clock sources and includes first gate means having an output for providing the first set of clock signals, second gate means having an output for providing the second set of clock signals, first select means coupled between the plurality of clock sources and the first gate means for providing the first gate means with clock signals from selected ones of the plurality of clock sources responsive to first selection signals, and second select means coupled between the plurality of clock sources and the second gate means for providing the second gate means with clock signals from selected ones of the plurality of clock sources responsive to second selection signals. The clock source selector further includes detect means for providing a control signal in response to detecting a change to a new first or second selection signal to change from the selection of a present clock source of the plurality of clock sources to a new clock source of the plurality of clock sources, first synchronizing means responsive to the control signal for disabling the second gate mean in synchronism with the present selected clock source of the plurality of clock sources provided to the second gate means and second synchronizing means responsive to the first synchronizing means disabling the second gate means for disabling the first gate means in synchronism with the present selected clock source of the plurality of clock sources provided to the first gate means and causing the new selection signal to be applied to the one of the first or second select means corresponding to the changing first or second selection signal to cause a transition from the present clock source to the new clock source. The first synchronizing means is also responsive to the transition for enabling the second gate means in synchronism with the clock source selected by the second selection means after the transition and the second synchronizing means is also responsive to the first synchronizing means enabling the second gate means for enabling the first gate means in synchronism with the clock source selected by the first selection means after the transition.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DETAILED DESCRIPTION OF THE PREFERRED EMBODIMENT

Figure 1:
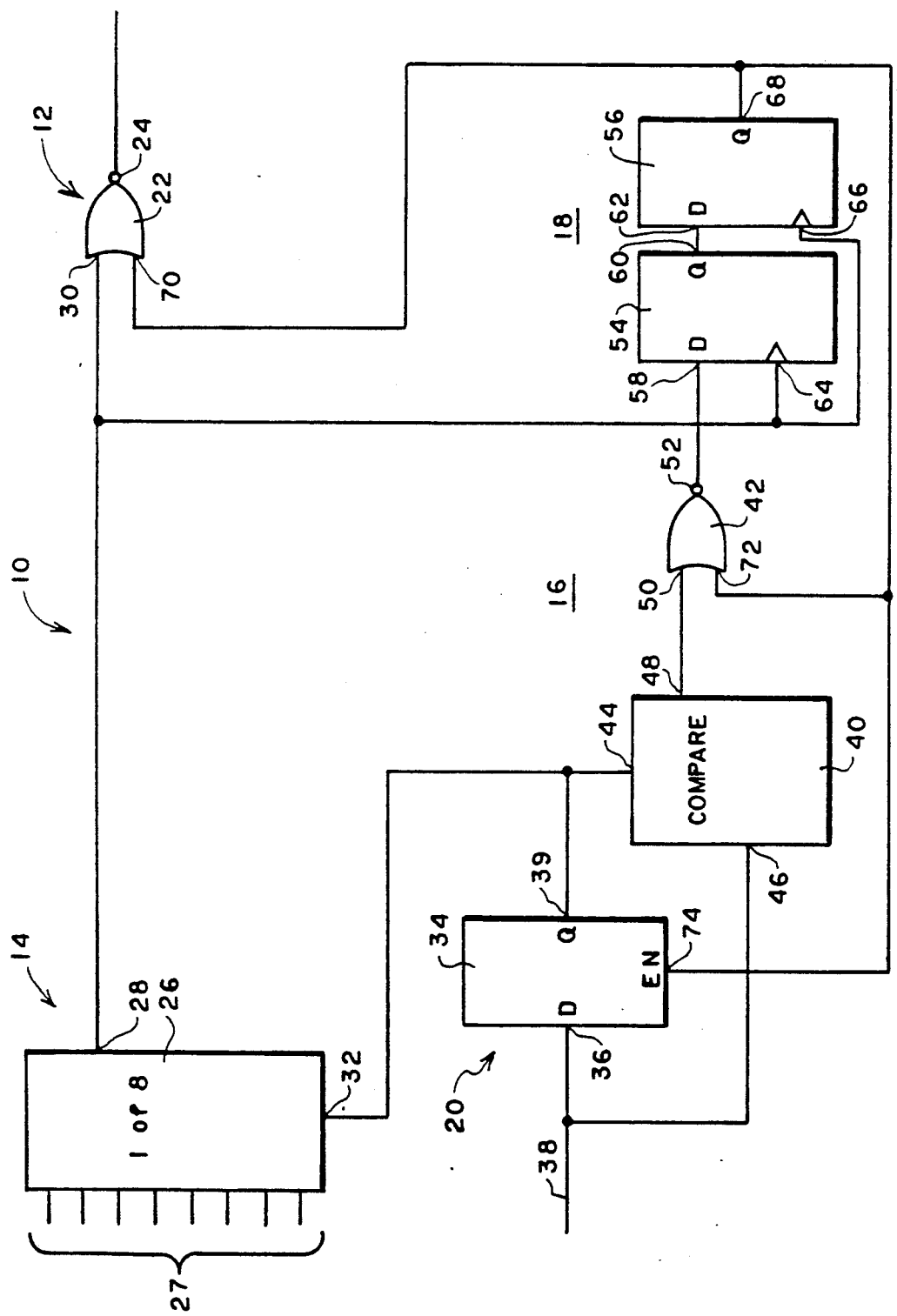
FIG. 1 is a schematic circuit diagram of a first clock source selector embodying the present invention.

Referring now to FIG. 1, it illustrates, in schematic circuit diagram form, a first clock source selector 10 embodying the present invention. The clock source selector 10 generally includes a gate means 12, a clock source select means 14, a detect means 16, a synchronizing means 18, and a latch means 20. The gate means 12 comprises a NOR gate 22 having an output 24 for providing output clock signals. The clock source select means 14 comprises a 1 of N selector 26 having input lines 27, with each line being adapted for connection to a respective different fixed clock source (not shown).

The selector 26, for example, may include eight input lines adapted for connection to eight different fixed clock sources. The selector 26 includes an output 28 which is coupled to an input 30 of NOR gate 22. Responsive to 3-bit selection signal received at a select input 32, the selector 26 couples a respective given one of the fixed clock sources to the input 30 of the NOR gate 22.

The latch means 20 comprises a latch 34 having a 3-bit input 36 which is coupled to a 3-bit parallel bus 38. The bus 38 is adapted to be coupled to a source of control signals, as for example, a central processing unit wherein the 3-bit selection signals select the particular fixed clock source at the inputs 27 of the selector 26 to be coupled to the NOR gate 22 for providing the clock signals to the output 24. The latch 34 includes an output 39 which is coupled to the select input 32 of the selector 26 and to the detect means 16.

The detect means 16 includes a comparator 40 and a NOR gate 42. The comparator 40 includes a first input 44 coupled to the output 39 of latch 34 and a second input 46 coupled to the control bus 38. The comparator 40 compares the present selection signal which is latched at the output of latch 34 to new selection signals received at its input 46. When the inputs 44 and 46 contain the same selection signal, the output 48 of the comparator 40 is at a high logic level. When the central processing unit provides a new selection signal, the comparator 40 detects the change in the selection signal and provides a low level at its output 48.

The output 48 of comparator 40 is coupled to an input 50 of NOR gate 42. The output 52 of NOR gate 42 is coupled to the synchronizing means 18.

The synchronizing means 18 comprises a first flip-flop 54 and a second flip-flop 56 which are coupled in series relation. Flip-flop 54 includes an input 58 which is coupled to the output 52 of NOR gate 42 and an output 60 which is coupled to an input 62 of flip-flop 56. Flip-flops 54 and 56 further include clock inputs 64 and 66 which are coupled to the output 28 of the selector 26. Lastly, flip-flop 56 includes an output 68 which is coupled to an enable input 70 of NOR gate 22, to an enable input 72 of NOR gate 42, and to a load enable input 74 of latch 34.

In operation, and assuming that the selector 26 is coupling one of the fixed clock sources at input 27 to input 30 of NOR gate 22 in accordance with the select signal at its input 32, the NOR gate 22 will provide the clock signals from the selected source at its output 24. Output 68 of latch 56 will be at a low level at this time.

When the central processing unit provides a new selection signal over bus 38, the comparator 40 will detect a change in the selection signal and provide a low level at output 48. Since both of the inputs 50 and 72 of NOR gate 42 are at a low level, it will provide a high level at its output 52 and at the input 58 of flip-flop 54. Upon the first rising edge of the present or old clock signal at output 28 of selector 26, the logical one at input 58 of flip-flop 54 will be transferred to the input 62 of flip-flop 56. Upon the second rising edge of the present clock signal, output 68 of flip-flop 56 will go to a high level to disable the NOR gate 22 to interrupt the provision of the clock signals to output 24 in synchronism with the present or old clock signal source. The high level at output 68 will also enable latch 34 to convey the new selection signal to its output 39 and to the select input 32 of the selector 26. The new selection signal will now be latched at the output 39 of the latch 34. The inputs 44 and 46 of comparator 40 will now contain the same selection signals causing its output 48 and input 50 of NOR gate 42 to go to a high. The high level at output 68 of flip-flop 56 also causes the enable input 72 of NOR gate 42 to go to a high level. The high levels at inputs 50 and 72 of NOR gate 42 causes the output 52 of NOR gate 42 to go to a low level.

Because the selector 26 has now selected the new fixed clock source corresponding to the new selection signal at its select input 32, it will provide the new clock signals at its output 28. However, NOR gate 22 has not yet been enabled and therefore the new clock signals will not be transferred to the output 24 of NOR gate 22 at this time.

The first rising edge of the new clock source signal after the transition from the old clock source to the new clock source will cause the low level at input 58 of flip-flop 54 to be conveyed to the input 62 of flip-flop 56. Upon the second rising edge of the new clock source, output 68 will go to a low level to enable NOR gate 22. With NOR gate 22 now enabled, it will pass the new clock signals provided at output 28 of selector 26 to its output 24. Since NOR gate 22 was enabled by the second rising edge of the new clock signal, the restarted clock signals at output 24 are restarted in synchronism with the new clock signals of the newly selected clock source.

The synchronizing means 18, in including two latches 54 and 56, comprises a two-stage synchronizer. Such a synchronizer is well known in the art for providing stability.

Figure 2:
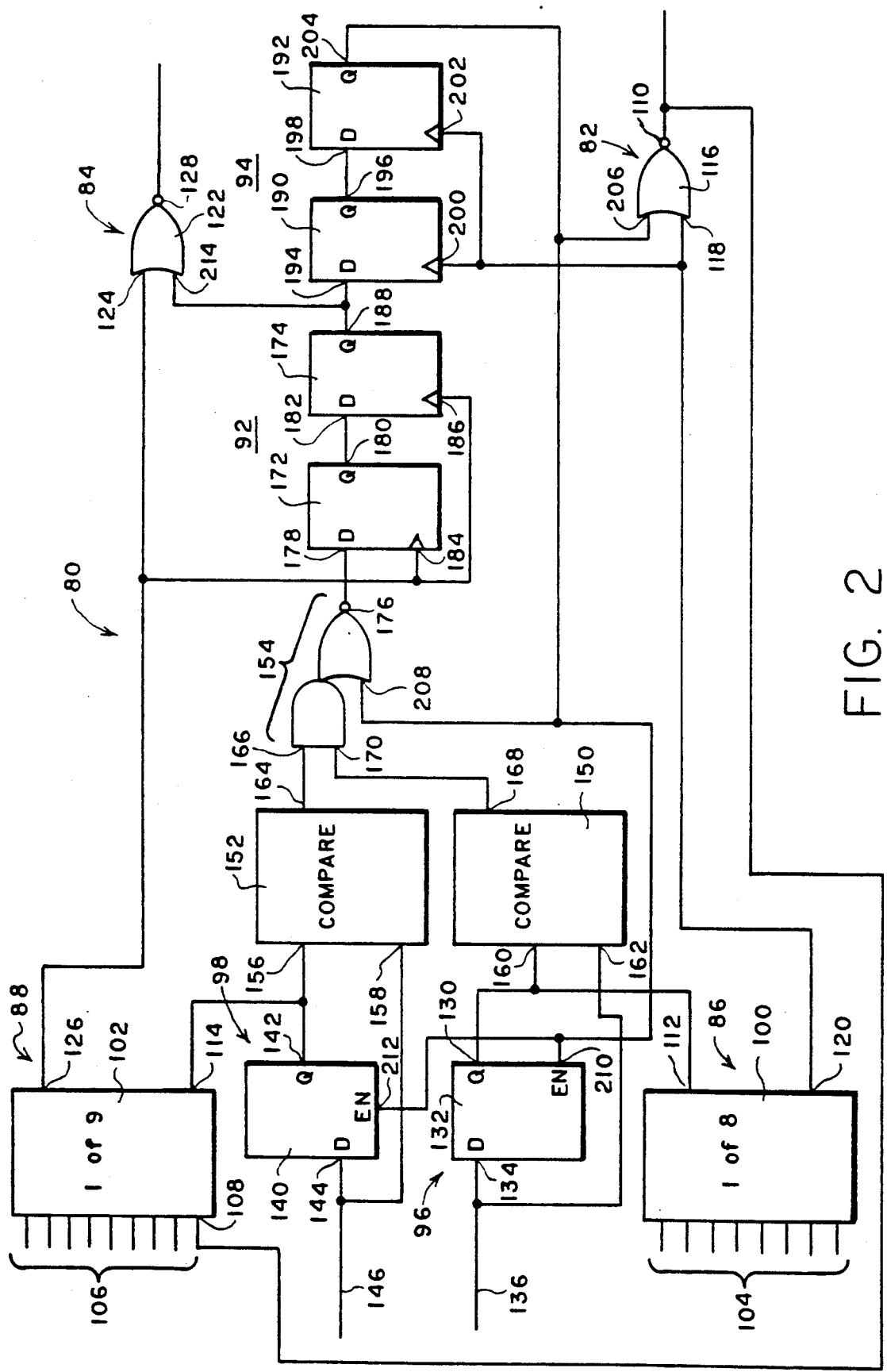
FIG. 2 is a schematic circuit diagram of another clock source selector embodying the present invention.

Referring now to FIG. 2, it illustrates a second clock source selector 80 embodying the present invention. The clock source selector 80 generally includes a first gate means 82, a second gate means 84, a first select means 86, a second select means 88, a detect means 90, a first synchronizing means 92, a second synchronizing means 94, a first latch means 96 and a second latch means 98.

Each of the select means 86 and 88 comprises a 1 of N selector 100 and 102. The selectors 100 and 102 include a plurality of input lines 104 and 106 adapted to be coupled to a plurality of fixed clock sources. The input lines 104 and 106 are preferably coupled to the same plurality of fixed clock sources. Selector 102 includes a further input line 108 which is coupled to the output 110 of the first gate means 82. As a result, selector 102 is coupled to one additional clock source as compared to selector 100. In accordance with this preferred embodiment, selector 100 is coupled to eight different fixed clock sources and selector 102 is coupled to the same eight clock sources and in addition, the output 110 of gate means 82. As a result, select input 112 of selector 100 is preferably a 3-bit input and select input 114 of selector 102 is preferably a 4-bit input.

The first gate means 82 comprises a NOR gate 116 having an input 118 coupled to the output 120 of the first selector 100. Similarly, the second gate means 84 comprises a NOR gate 122 having an input 124 coupled to the output 126 of selector 102. NOR gate 122 also has an output 128. The output 110 of first NOR gate 116 provides a first set of clock signals and the output 128 of NOR gate 122 provides a second set of clock signals.

For selecting the various fixed clock sources by selector 100, the 3-bit select input 112 is coupled to an output 130 of the first latch 132 which comprises the first latch means 96. The latch 132 includes a 3-bit input 134 coupled to a 3-bit parallel control bus 136 which is preferably coupled to a central processing unit for receiving first selection signals to enable the selection of the clock sources by the first selector 100.

Similarly, latch means 98 comprises a second latch which has a 4-bit input 144 coupled to a 4-bit parallel control bus 146 for receiving second selection signals from the central processing unit. Latch 140 also includes a 4-bit output 142 which is coupled to the 4-bit select input 114 of the second selection 102.

The detect means 90 comprises a first comparator 150, a second comparator 152, and an AND OR INVERT gate 154. Comparator 152 includes a first input 156 coupled to output 142 of latch 140 and a second input 158 coupled to the bus 146. Similarly, comparator 150 includes a first input 160 coupled to the output 130 of latch 132 and a second input 162 coupled to bus 136.

The output 164 of comparator 152 is coupled to an input 166 of the AND OR INVERT gate 154 and the output 168 of comparator 150 is coupled to the other input 170 of the AND OR INVERT gate 154.

The first synchronizing means 92 comprises a two-stage synchronizer including a first flip-flop 172 and a second flip-flop 174. The output 176 of the AND OR INVERT gate 154 is coupled to an input 178 of flip flop 72. The output 180 of flip-flop 172 is coupled to an input 182 of flip-flop 174. The clock inputs 184 and 186 of flip-flops 172 and 174 are coupled to the output 126 of the second selector 102.

The second synchronizing means 94 also comprises a 2-stage synchronizer including a first flip-flop 190 and a second flip-flop 192. The output 188 of flip-flop 174 is coupled to an input 194 of flip-flop 190. The output 196 of flip-flop 190 is coupled to an input 198 of flip-flop 192. The clock inputs 200 and 202 of flip-flops 190 and 192 are coupled to the output 120 of the first selector 100.

Lastly, flip-flop 192 includes an output 204 which is coupled the enable input 206 of NOR gate 116 to an enable input 208 of the AND OR INVERT gate 154 and to the load enable inputs 210 and 212 of the first and second latches 132 and 140. The output 188 of flip-flop 174 is also coupled to an enable input 214 of NOR gate 122.

In operation, and assuming that both the first selector 100 and second selector 102 are currently selecting a clock source and providing the clock signals from these clock sources to the first and second NOR gates 116 and 122 so that the clock signals are appearing at the outputs 110 and 128 of NOR gates 116 and 122, when one of the selection signals on buses 136 or 146 changes corresponding to a change in the selection of a clock source by either selector 100 or 102, the change in the first or second select signal will be detected by one of the comparators 150 or 152. The AND OR INVERT gate will then provide a high logic level at output 176 which is impressed upon input 178 of flip-flop 172. Upon the first rising edge of the clock signal provided by the present clock source selected by the second selector 102, the high logic level will be conveyed from input 178 to input 182 of flip-flop 174. Upon the second rising edge of the present clock signal provided by the clock source selected by selector 102, output 188 of flip-flop 174 will go to a high level to disable NOR gate 122. In response to the high level at input 188, upon the first rising edge of the clock source presently selected by selector 100, the high logic level at input 194 of flip-flop 190 will be conveyed to its output 196 and to input 198 of flip-flop 192. Upon the second rising edge of the clock signal provided by the clock source presently selected by the first selector 100, output 204 of flip-flop 192 will go high to disable NOR gate 116. As a result, the second NOR gate 122 is disabled in synchronism with the present clock source selected by selector 102 to terminate the clock signals provided at output 128 of NOR gate 122 in synchronism with the old clock source selected by the second selector 102. Similarly, when NOR gate 116 is disabled, it is disabled in synchronism with the clock source selected by the first selector 100. Hence, the clock signals at output 110 of NOR gate 116 are terminated after the clock signals at output 128 of NOR gate 122 are terminated.

The high level at output 204 of flip-flop 92 which disabled NOR gate 116 is impressed upon the load enable inputs 210 and 212 of latches 132 and 140 to cause the new select signal to be loaded into the corresponding selector 102 or 100. The high level also causes input 208 of the AND OR INVERT gate to be enabled to cause the output 176 to go to a low level. Upon the first transition of the new clock signal provided by the clock source now being selected by selector 102, the output 180 of flip-flop 172 and the input 182 of flip-flop 174 will go to a low level. Upon the second rising edge of the new clock signal of the clock source selected by the second selector 102, the output 188 will go to a low level to enable NOR gate 122 so that the clock signals of the new clock source selected by the second selector 102 will appear at the output 128 of NOR gate 122 in synchronism with the new clock source selected by selector 102.

Upon the first rising edge of the new clock signal provided by the new clock source selected by selector 100, output 196 of flip-flop 190 and input 198 of flip-flop 192 rising edge of the new clock source selected by selector 100, output 204 of flip-flop 192 will go to a low level to enable NOR gate 116. As a result, the new clock signals provided by the new clock source selected by selector 100 now appear at output 110 of NOR gate 116 in synchronism therewith.

Hence, it can be seen that two clocks are controlled in the embodiment of FIG. 2. Because the output of NOR gate 116 is coupled to one of the select lines of selector 102, a sequential approach to controlling the clocks is necessitated. As a result, when there is a change in one of the first or second selection signals, the change is synchronized to the present second clock selected by selector 102 and the second clock output 128 is stopped in synchronism to the old clock source selected by selector 102. The first clock output 110 is then stopped in synchronism with the old clock source selected by selector 100. When NOR gate 116 is disabled, the new selection signal is loaded into the appropriate selector and then the second NOR gate 122 is enabled is synchronism with the new clock source selected by the second selector 102. Following the enablement of NOR gate 122, the first NOR gate 116 is enabled in synchronism with the new clock source now selected by selector 100. As a result, the stopping and starting of the clock sources is obtained in synchronism with the old and the new clock sources. As will be appreciated by those skilled in the art, this mechanism may be extended to any number of input clock sources or any number of output clocks without departing from the present invention.

While particular embodiments of the present invention have been shown and described, modifications may be made, and it is therefore intended to cover in the appended claims all such changes and modifications which fall within the true spirit and scope of the invention.

What is claimed is:

1. A clock source selector for providing at least one set of lock signals selected from a plurality of clock sources, said clock source selector providing a synchronized transition from an old clock source to a new clock source and comprising:

gate means having first and second inputs and an output for providing said clock signals;

clock source select means coupled between said plurality of clock sources and said gate means first input for providing said gate means with clock signals from selected ones of said clock sources responsive to selection signals;

detect means for detecting a change in said selection signals representing a change from an old clock source to a new clock source; and synchronizing means responsive to said detect means and coupled to said gate means second input for disabling said gate means in synchronism with said old clock source and thereafter enabling said gate means in synchronism with said new clock source.

2. A clock source selector as defined in claim 1 wherein said detect means comprises a comparator for comparing an old selection signal corresponding to said old clock source to a new selection signal corresponding to said new clock source.

3. A clock source selector as defined in claim 2 further comprising latch means for latching said old selection signal, said latch means having an input for receiving said selection signals, an output coupled to said select means for providing said select means with said old selection signal which has been latched, and an enable input responsive to said synchronizing means for conveying said new selection signal to said select means when said gate means is disabled.

4. A clock source selector as defined in claim 3 wherein said synchronizing means is coupled to said select means for receiving the clock signals of said old and new clock sources.

5. A clock source selector as defined in claim 4 wherein said synchronizing means is a two-stage synchronizer for disabling said gate means at least one full cycle of the signal of said old clock source after said detect means detects said changes in said selection signals and for enabling said gate means at least one full cycle of the signal of said new clock source after disabling said gate means.

6. A clock source selector as defined in claim 5 wherein said synchronizing means includes an output coupled to said gate means second input and said latch means enable input.

7. A clock source selector as defined in claim 6 wherein said detect means further includes a NOR gate coupled between said comparator and said synchronizing means.

8. A clock source selector as defined in claim 7 wherein said synchronizing means comprises first and second serial coupled flip-flops.

9. A clock source selector for providing at least first and second sets of clock signals selected from a plurality of clock sources, said clock source selector providing synchronized transitions between a change in the selection of a present clock source to a new clock source and comprising:

first gate means having an output for providing said first set of clock signals;

second gate means having an output for providing said second set of clock signals;

first select means coupled between said plurality of clock sources and said first gate means for providing said first gate means with clock signals from selected ones of said plurality of clock sources responsive to a first selection signal;

second select means coupled between said plurality of clock sources and said second gate means for providing said second gate means with clock signals from selected ones of said plurality of clock sources responsive to a second selection signal;

detect means for providing a control signal in response to detecting a change in said first or second selection signals from a present selection signal to a new selection signal representing a change in the selection of a present clock source of said plurality of clock sources to a new clock source of said plurality of clock sources;

first synchronizing means responsive to said control signal for disabling said second gate means in synchronism with the present clock source of said plurality of clock sources provided to said second gate means; and second synchronizing means responsive to said first synchronizing means disabling said second gate means for disabling said first gate means in synchronism with the present clock source of said plurality of clock sources provided to said first gate means and causing said new selection signal to be applied to one of said first or second select means corresponding to said changing first or second selection signal to cause a change in selection from said present clock source to said new clock source, said first synchronizing means being responsive to said change in selection for enabling said second gate means in synchronism with the clock source selected by said second selection means after said change in selection, and said second synchronizing means being responsive to said first synchronizing means enabling said second gate means for enabling said first gate means in synchronism with the clock source selected by said first selection means after said change in selection.

10. A clock source selector as defined in claim 9 wherein said second select means includes a plurality of inputs for being coupled to said plurality of clock sources and wherein said first gate output is coupled to one of said plurality of inputs of said second select means.

11. A clock source selector as defined in claim 9 wherein said first and second synchronizing means are coupled in series relation.

12. A clock source selector as defined in claim 11 wherein each said first and second synchronizing means is a two-stage synchronizer.

13. A clock source selector as defined in claim 12 wherein each said two-stage synchronizer comprises first and second series coupled latches.

14. A clock source selector as defined in claim 9 wherein said detect means comprises a first comparator having an output and a pair of inputs for comparing a present first selection signal with a new first selection signal, a second comparator having an output and a pair of inputs for comparing a present second selection signal with a new second selection signal, and third gate means having inputs coupled to said outputs of said first and second comparators, said third gate means also having an output coupled to said first synchronizing means.

15. A clock source selector as defined in claim 14 wherein said third gate means comprises an AND OR INVERT gate.

16. A clock source selector as defined in claim 9 further comprising a first latch having an output coupled to said first select means for latching said present first selection signal, an input for receiving said new first selection signal, and an enable input coupled to said second synchronizing means for conveying said new first selection signal to said first select means to cause said change in selection in response to said second synchronizing means disabling said first gate means.

17. A clock source selector as defined in claim 16 further including a second latch having an output coupled to said second select means for latching said present second selection signal, an input for receiving said new second selection signal, and an enable input coupled to said second synchronizing means for conveying said new second selection signal to said second select means to cause said change in selection in response to said second synchronizing means disabling said first gate means.

18. A clock source selector as defined in claim 9 wherein said first gate means includes an enable input coupled to said second synchronizing means.

19. A clock source selector as defined in claim 9 wherein said second gate means includes an enable input coupled to said first synchronizing means.

* * * * *